(12) United States Patent
Eilmsteiner et al.

(10) Patent No.: US 12,174,548 B2
(45) Date of Patent: Dec. 24, 2024

(54) FORMATION OF THREE-DIMENSIONAL STRUCTURES USING GREY-SCALE PHOTOLITHOGRAPHY

(71) Applicant: ams AG, Premstaetten (AT)

(72) Inventors: Gerhard Eilmsteiner, Eindhoven (NL); Primoz Kusar, Eindhoven (NL)

(73) Assignee: ams AG, Premstaetten (AT)

( * ) Notice: Subject to any disclaimer, the term of this patent is extended or adjusted under 35 U.S.C. 154(b) by 684 days.

(21) Appl. No.: 17/297,297

(22) PCT Filed: Nov. 11, 2019

(86) PCT No.: PCT/EP2019/080905
§ 371 (c)(1),
(2) Date: May 26, 2021

(87) PCT Pub. No.: WO2020/108973
PCT Pub. Date: Jun. 4, 2020

(65) Prior Publication Data
US 2021/0405541 A1 Dec. 30, 2021

Related U.S. Application Data

(60) Provisional application No. 62/771,659, filed on Nov. 27, 2018.

(51) Int. Cl.
*G03F 7/00* (2006.01)
*H01L 21/311* (2006.01)
*H01L 31/0216* (2014.01)

(52) U.S. Cl.
CPC .... *G03F 7/70283* (2013.01); *H01L 21/31144* (2013.01); *H01L 31/02162* (2013.01)

(58) Field of Classification Search
CPC ............. G03F 7/70283; G03F 7/70416; H01L 21/31144; H01L 31/02162
See application file for complete search history.

(56) References Cited

U.S. PATENT DOCUMENTS

| 4,054,389 A | 10/1977 | Owen |
| 5,308,415 A | 5/1994 | Chou |

(Continued)

FOREIGN PATENT DOCUMENTS

| JP | S533170 A | 1/1978 |
| KR | 20130090368 A | 8/2013 |
| TW | 200634906 A | 10/2006 |

OTHER PUBLICATIONS

International Search Report for Application No. PCT/EP2019/080905 dated Jun. 18, 2020.

(Continued)

*Primary Examiner* — Mamadou L Diallo
(74) *Attorney, Agent, or Firm* — Tarolli, Sundheim, Covell & Tummino LLP

(57) ABSTRACT

Forming a three-dimensional structure includes applying photoresist on a layer and using a photolithography system to expose the photoresist. The photolithography system includes a photomask having a pattern thereon, where the pattern provides varying pattern density across a surface of the photomask and has a pitch that is less than a resolution of the photolithography system. The method includes subsequently developing the photoresist such that photoresist remaining on the layer has a three-dimensional profile defined by the photomask. An isotropic etchant is used to etch the layer such that the three-dimensional profile of the photoresist is transferred to the layer.

13 Claims, 5 Drawing Sheets

(56) References Cited

U.S. PATENT DOCUMENTS

| | | | |
|---|---|---|---|
| 5,784,507 A | | 7/1998 | Holm-Kennedy et al. |
| 6,896,949 B1 | | 5/2005 | Scobey et al. |
| 2003/0180628 A1 | * | 9/2003 | Lai ............................ G03F 1/50 430/324 |
| 2005/0233228 A1 | | 10/2005 | Fijol et al. |
| 2007/0076210 A1 | | 4/2007 | Kiesel et al. |
| 2009/0092934 A1 | | 4/2009 | Christophersen et al. |
| 2009/0170033 A1 | * | 7/2009 | Jung ................ H01L 21/32139 430/319 |
| 2009/0203156 A1 | | 8/2009 | Starzynski |
| 2010/0055882 A1 | | 3/2010 | Imhoff et al. |
| 2010/0304568 A1 | * | 12/2010 | Miyoshi ............ H01L 21/31144 430/311 |
| 2011/0091797 A1 | * | 4/2011 | Chang ....................... G03F 1/50 430/5 |
| 2015/0080802 A1 | * | 3/2015 | Kang ................ A61M 37/0015 604/173 |
| 2016/0141065 A1 | * | 5/2016 | Nishizawa ........... A61N 1/0404 156/247 |
| 2019/0079395 A1 | * | 3/2019 | Ishii .......................... G03F 1/26 |
| 2019/0252506 A1 | * | 8/2019 | Ma ..................... H01L 21/3081 |

OTHER PUBLICATIONS

Chinese Office Action for CN application No. 201980078329.0, dated Jul. 12, 2024, 14 pages.

* cited by examiner

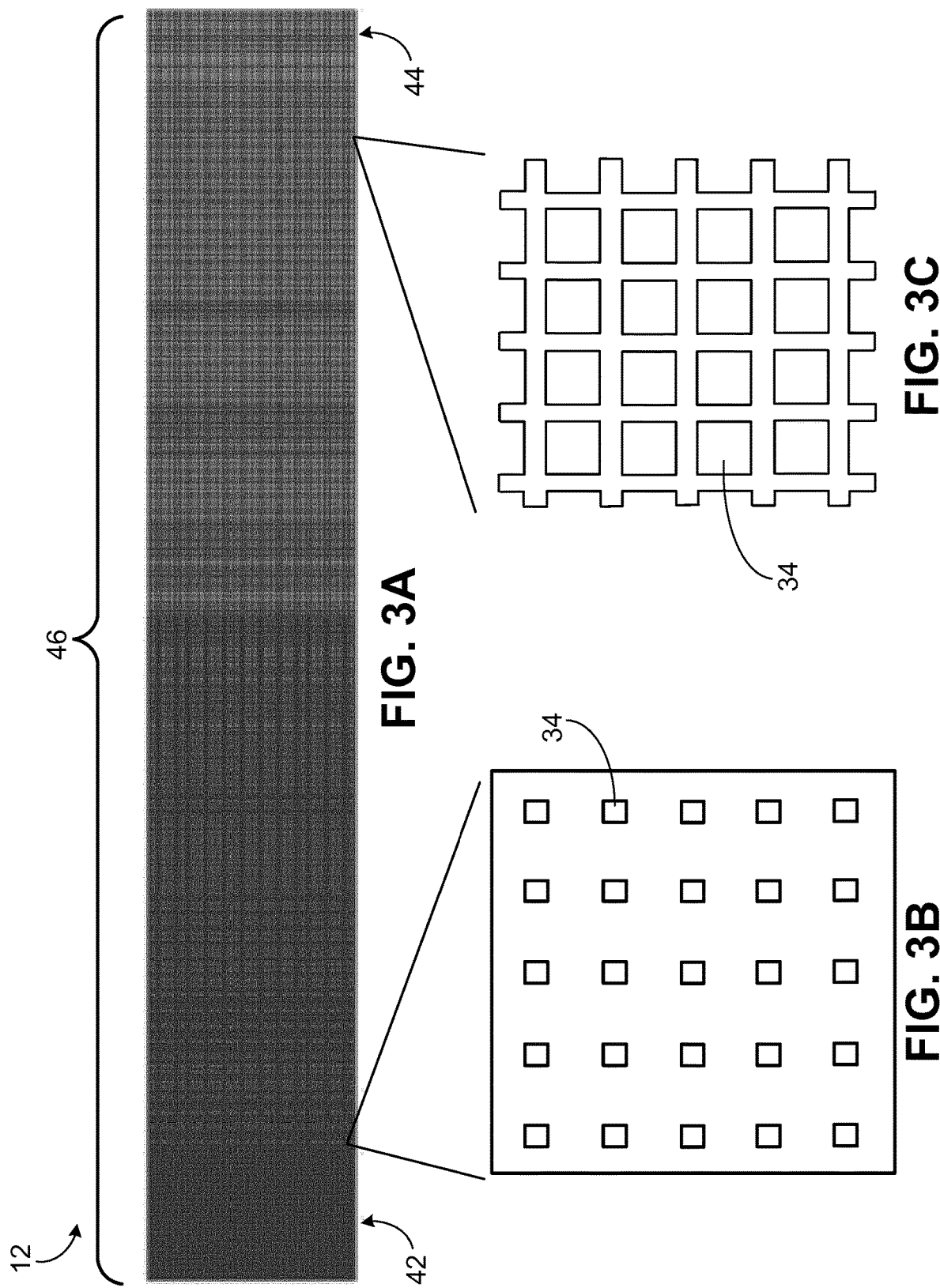

FORMATION OF THREE-DIMENSIONAL STRUCTURES USING GREY-SCALE PHOTOLITHOGRAPHY

RELATED APPLICATIONS

The present invention is a U.S. National Stage under 35 USC 371 patent application, claiming priority to Serial No. PCT/EP2019/080905, filed on 11 Nov. 2019; which claims priority of U.S. Provisional Application Ser. No. 62/771,659, filed on 27 Nov. 2018, the entirety of both of which are incorporated herein by reference.

FIELD OF THE DISCLOSURE

This disclosure relates to the formation of three-dimensional structures using grey-scale photolithography.

BACKGROUND

Semiconductor fabrication technologies based on processes developed for silicon integrated circuits generally are suitable for planar structures formed in or on the bulk silicon material. However, there is an increasing interest in batch fabrication techniques that can be used to obtain gradient height profiles (i.e., structures having or varying multiple heights) on the semiconductor wafer.

SUMMARY

The present disclosure describes the formation of three-dimensional (3D) structures using grey-scale photolithography. For example, using the techniques described in this disclosure, 3D structures can be formed directly in silicon dioxide ($SiO_2$) or other material on a substrate such as a semiconductor wafer.

In one aspect, for example, the disclosure describes a method of forming a three-dimensional structure including applying photoresist on a layer and using a photolithography system to expose the photoresist. The photolithography system includes a photomask having a pattern thereon, where the pattern provides varying pattern density across a surface of the photomask and has a pitch that is less than a resolution of the photolithography system. The method includes subsequently developing the photoresist such that photoresist remaining on the layer has a three-dimensional profile defined by the photomask. An isotropic etchant is used to etch the layer such that the three-dimensional profile of the photoresist is transferred to the layer.

Some implementations include one or more of the following features. For example, in some instances, the layer is composed of $SiO_2$. In some implementations, the pattern density of the photomask increases continuously from a first end of the pattern to an opposite second end of the pattern. The pattern density of the pattern on the photomask can vary continuously, for example, by using different sized openings in a light blocking layer. In some cases, the pattern has a pitch size that is constant, whereas in other cases, the pattern has a pitch size that is modulated. In some instances, the pattern on the photomask comprises a border zone layout.

In some implementations, the isotropic etchant includes fluorine. The isotropic etchant can be chosen to provide an etch rate of the photoresist that is about the same as an etch rate of the $SiO_2$.

In some implementations, the three-dimensional profile has a wedge-shape and/or a continuously increasing thickness.

In some implementations, the layer is disposed over a light sensing device. The method can include forming an optical filter layer on a surface of the layer to which the three-dimensional profile is transferred, or forming a stack of optical filter layers on a surface of the layer to which the three-dimensional profile is transferred. In some instances, the layer to which the three-dimensional profile is transferred serves as a cavity of a Farby-Perot interferometer.

Thus, the technique described here can be used to fabricate three-dimensional (3D) features that can be integrated into various types of devices. For example, the disclosure describes a device including a support, and an $SiO_2$ layer disposed on the support, wherein the $SiO_2$ layer has a three-dimensional profile having a continuously increasing thickness.

The disclosure also describes a light sensing device that includes a photodiode having a light-sensitive region, and a backend 3D (e.g., wedge-shaped) oxide layer (e.g., $SiO_2$) disposed over the light sensitive region. In some implementations, the light sensing device includes an optical filter layer or a stack of optical filter layers on a surface of the oxide layer.

The disclosure also describes a Fabry-Perot interferometer that includes one or more photosensitive elements, and a wedge-shaped cavity composed of an optical filter material (e.g., $SiO_2$). A first reflecting minor is disposed between a first surface of the optical filter material and the photosensitive elements, and a second reflecting minor is disposed over a second surface of the optical filter material, wherein the second surface is at a side of the optical filter material opposite the first surface.

Some implementations provide one or more of the following advantages. For example, by use of 3D structuring, the backend $SiO_2$ optical properties of a photodiode device can be improved. In some cases, the device's optical responsivity can be improved by use of the varying $SiO_2$ thickness, which averages out interference effects (i.e., ripples in responsivity). Grey-scale lithography and subsequent etching also can be used for the manufacturing of linear variable filters (LVFs). This approach can help reduce the complexity and overall manufacturing costs.

Other aspects, features and advantages will be readily apparent from the following detailed description, the accompanying drawings, and the claims.

BRIEF DESCRIPTION OF THE DRAWINGS

FIG. 3A illustrates an example of photomask having different open area ratios that can be used for grey-scale photolithography.

FIGS. 3B and 3C illustrate portions of the photomask of FIG. 3A.

DETAILED DESCRIPTION

Figure 1:
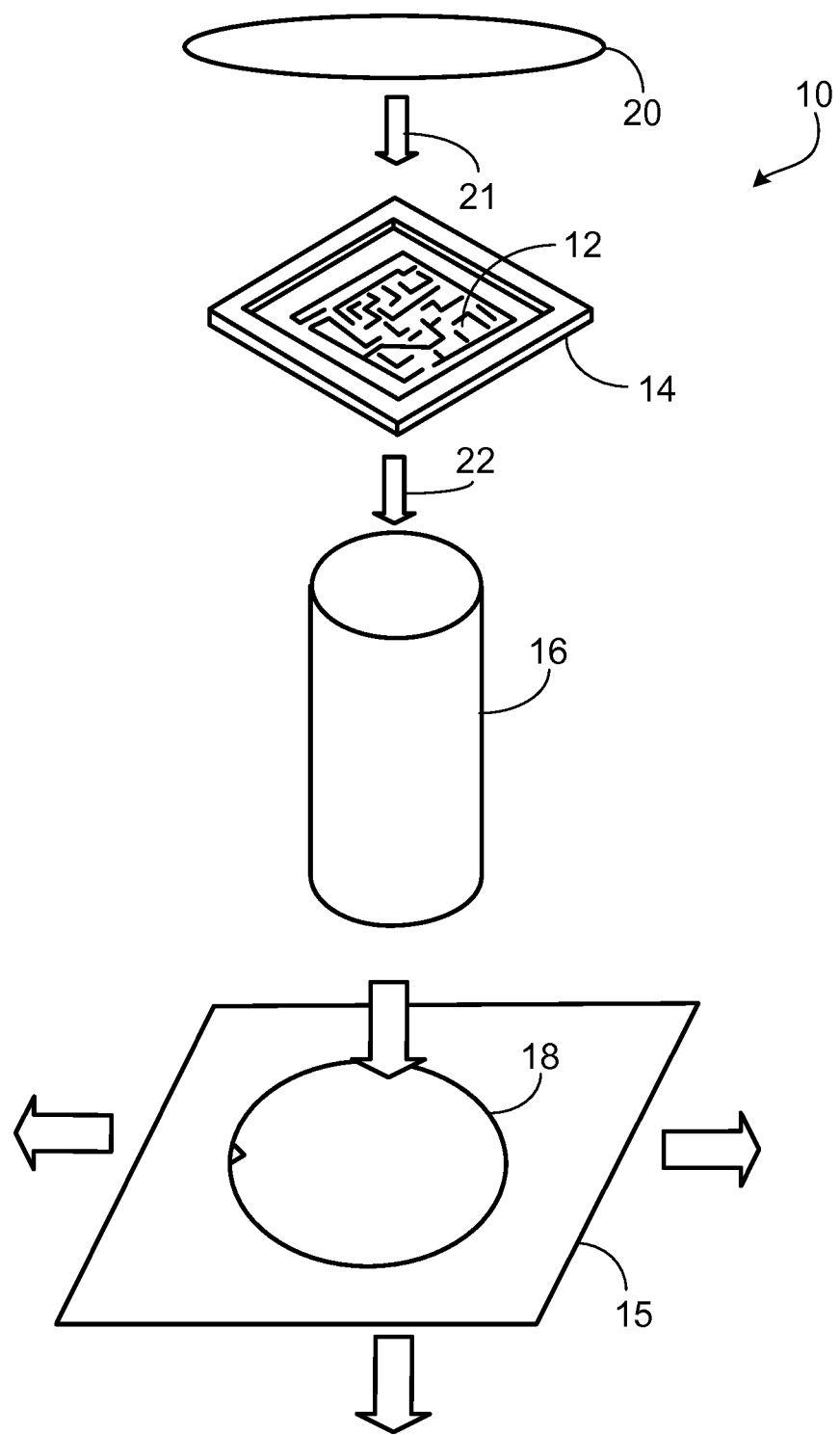
FIG. 1 illustrates an example of a photolithography system.

As shown in FIG. 1, a semiconductor photolithography system 10 implements a process in which complex circuit or other patterns 12 on a photomask 14 made, for example, of a large glass plate are reduced using ultra-high-performance projection lenses 16 and exposed onto a silicon or other substrate known as a wafer 18. The pattern 12 can be formed, for example, using chrome or other metal. The semiconductor lithography system 10 is operable to align the mask 14 and the wafer 18, which may be supported on a movable stage 15.

A silicon wafer 18 can be prepared for photolithography, for example, by coating it with a layer of silicon nitride followed by a layer of silicon dioxide, and then applying a layer of photoresist. Ultra-violet (UV) light 21, for example, from an illuminator 20 is projected through the mask 14 that contains the pattern 12 to be transferred and formed on the wafer 18. In some implementations, the illumination settings can be consistent with those for an i-line stepper (i.e., $\lambda=365$ nm), although other settings may be appropriate for some implementations. The light 22 passing through the mask 14 is projected onto the photoresist-coated wafer. In this manner, portions of the photoresist are exposed to light. The exposed photoresist becomes soluble and subsequently is developed away, leaving a reduced image of the pattern 12 on the wafer 18. Additional circuit elements or other features can be formed on the wafer by using additional photomasks.

Grey-scale photolithography can be used to create gradient height structures and, in some instances, involves a one-level lithography process that facilitates the development of gradient height profiles in a photoresist-masking layer, which sometimes is referred to as a nested mask (i.e., one that results in multiple height levels).

In general, fabrication of gradient height structures (i.e., structures having multiple heights) in a material layer (e.g., silicon dioxide) includes a first step, in which the shape of the structure is patterned in the photoresist layer by the use of gray-scale lithography, and a second step in which the photoresist layer is used as a nested mask for etching. In this latter step, the structure is translated into the material layer to a specified depth corresponding to the height of the desired final structure.

Diffraction is one of the key issues in lithography because limits the resolution capability of a projection system. Various efforts have been tried to overcome this limitation. Approaches include the reduction of the wavelength further out in the deep UV, lens systems capable of high numerical aperture (NA) illumination, and the introduction of advanced reticle techniques such as phase shift masks. The present manufacturing method makes explicit use of diffraction effects to create a modulated intensity pattern or a modulated exposure dose across the surface of the photoresist-covered wafer 18. When the features of the pattern 12 and the spacing between them are sufficiently small (i.e., less than the resolution of the lithography system 10), the features are not printed in the photoresist. Nevertheless, the effective light intensity can be tuned based on the pattern geometry.

Figure 2A:
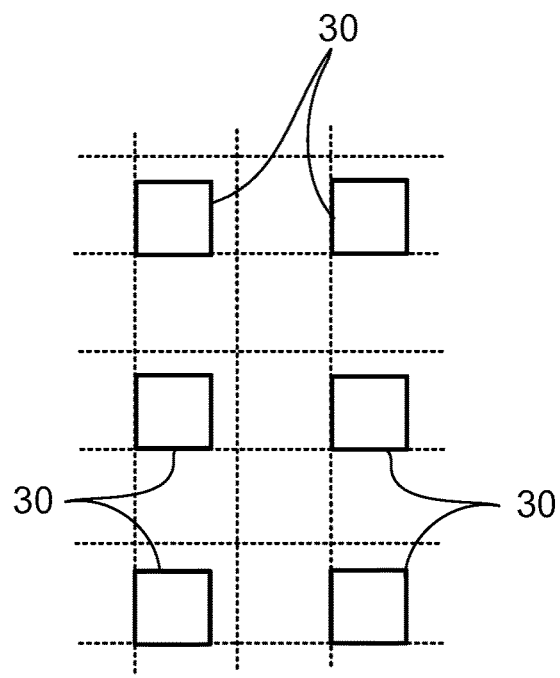
FIG. 2A illustrates an approach to achieve grey scale suitable for low mask coverage.
Figure 2B:
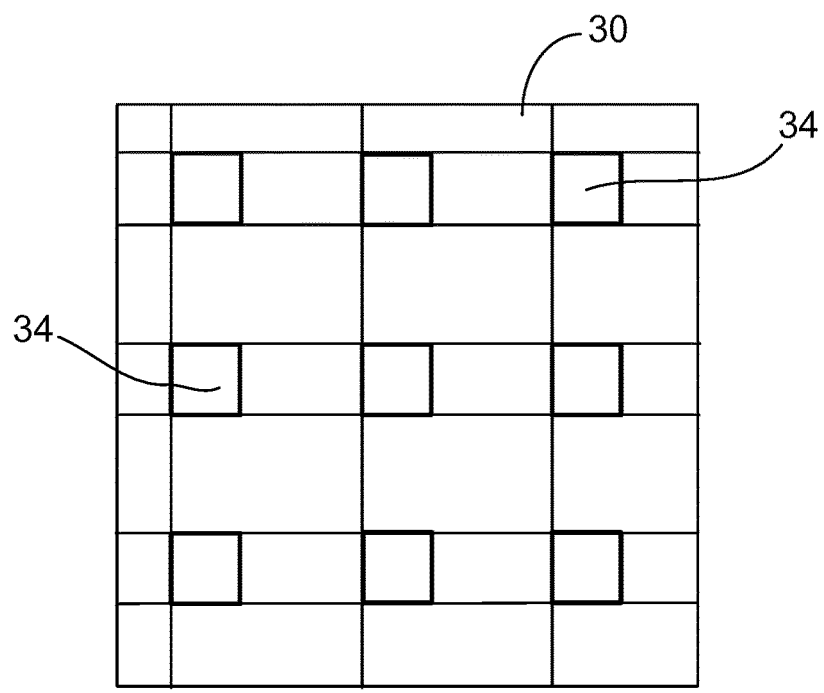
FIG. 2B illustrates an approach to achieve grey scale suitable for high mask coverage.

In general, the intensity of the light passing through the mask 14 depends on the fill area and the pitch. For instance, as shown in FIG. 2A, if the mask 14 is designed with square pixels and a fixed pitch for the pixels, then the intensity depends on the percentage of the coverage of the opaque area 30 (e.g., square pixel size at fixed pitch). FIG. 2B illustrates an example in which a lower amount of transmission through the mask 14 can be achieved by increasing the coverage of the opaque area 30. In this latter case, the mask 14 has smaller square-shaped openings 34 through which the UV light can pass. Due to mask fabrication capabilities, the structures in FIG. 2A are more suitable for use for areas with higher transmission, and the structures in FIG. 2B are more suitable for lower transmission.

Gray-scale lithography can use locally modulated transmission to achieve locally modulated exposure doses to develop a three-dimensional (3D) structure in the photoresist. Differential exposure doses lead to multiple depths of exposed photoresist across the surface, which is caused by the UV light energy being absorbed by the photoactive compound as the light travels into the photoresist. From the differential exposure doses, a gradient height photoresist structure corresponding to the 3D structure will remain after the photoresist is developed.

For grey-scale lithography, the mask 14 is provided with a modulated pattern density (e.g., the percentage of light blocking area (e.g., chrome-covered)) across the surface of the mask. The pitch, which in some instances is kept constant even though the pattern density is varied, is chosen to be below the resolution of the projection system 10 so that the distance between pixels remains below resolution. In some cases, both the pixel size and pitch are modulated.

Figure 4:
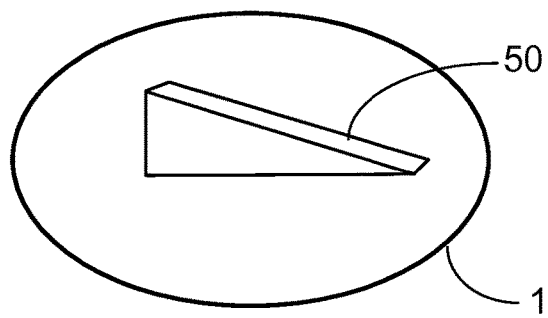
FIG. 4 illustrates an example of 3D structure formed in a photoresist layer using the photomask of FIG. 3A.

FIG. 3A illustrates an example of a grey-scale mask pattern 12 for forming a 3D (e.g., wedge-shaped) feature 50 in the photoresist layer on the wafer 18, as shown in FIG. 4. In the example of FIG. 3A, the far left-hand side 42 of the pattern 12 is fully covered (e.g., with chrome) so that there is no exposure (i.e., 0% transmission) of a first portion of the photoresist layer. As one moves toward the right-hand side of the pattern 12, the pattern provides slowly varying coverage (e.g., by using different sized openings), with the far right-hand side 44 of the pattern having little or no coverage to allow for full exposure (100% transmission) of a portion of a second portion of the photoresist layer. In the illustrated example, the intermediate part 46 of the pattern 12 uses a border zone layout to achieve a smooth transition in the grey scale by continuously varying the dimensions of the openings, for example, from about 235 nm (see FIG. 3B) to about 340 nm (see FIG. 3C) as one proceeds from left to right in FIG. 3A (at a pitch of 400 nm). Because the geometries are below the resolution limit of the lithography system 10, the structure of the border zone layout is not printed into the photoresist layer.

In the illustrated example, the pitch for the different grey levels is constant at about 400 nm, although other values may be appropriate for some implementations. In some instances, structures having dimensions on the order of several µm and target thickness variations of about 0.5 µm can be achieved, resulting in sufficient surface smoothness to allow for subsequent deposition of filter or other optical layers. In some instances, even lower thickness variations (e.g., for dimensions <3 µm) can be implemented. In some implementations, structures larger than the underlying photosensitive device (e.g., pixels in the case of imaging sensors) can be used. For the larger wedge structure, each pixel would correspond to a different thickness. In some cases, the intensity of the light 22 passing through the different portions of the mask 12 transitions slowly from about 12% (FIG. 3B) to about 55% (FIG. 3C).

The sub-resolution size of the features in the mask pattern 12 and the slow size variation in the size of the features (e.g., the openings 34 in the chrome) results in a smooth height transition in the photoresist layer after exposure and development (see FIG. 4). The 3D profile 50 of the developed photoresist layer, which can be performed in a single illumination step, can be translated to an underlying layer using a wet or dry etching technique. For example, if the underlying layer is a $SiO_2$ layer on the semiconductor wafer 18, the 3D profile 50 of the developed photoresist layer can be transferred to the $SiO_2$ layer using an isotropic etchant containing fluorine (e.g., $SF_6$, $NF_3$, $CF_4O_2$ or $CF_4$). The $SiO_2$ layer may be a native oxide layer or may be a separately grown layer. Use of an isotropic etch can be advantageous for forming a wedge-shaped $SiO_2$ layer (i.e., having a continuously changing thickness) having a relatively smooth sloped surface. Preferably, the etchant should be chosen such that the etch rate of the photoresist is about the same as the etch rate of the $SiO_2$ (e.g., 1:1 ratio) in order to transfer the photoresist profile to the underlying layer. Other etch rate ratios can be used if transferred profile/application needs higher or lower variations than in resist.

In the example of FIG. 4, it is assumed that the mask is fully transparent around the structure of FIG. 3A. In other implementations, the mask can be fully opaque around the structure of FIG. 3A so as to block light from the illuminator 20.

The following paragraphs describe various examples of devices in which a 3D (e.g., wedge-shaped) $SiO_2$ layer, fabricated according to the foregoing technique(s), can be incorporated.

Figure 5:
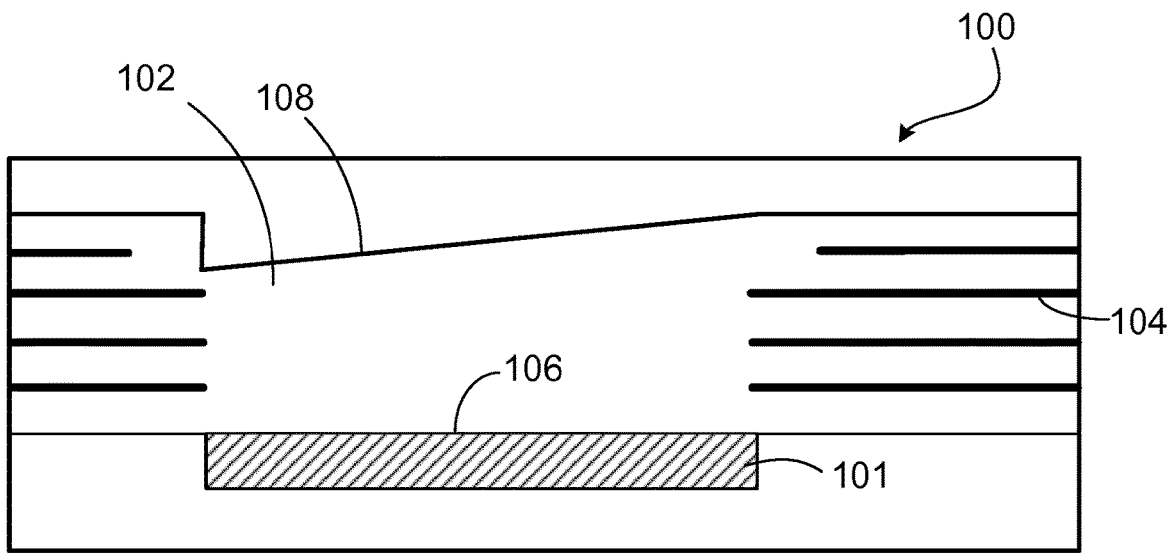
FIG. 5 illustrates an example of a light sensing device including a wedge-shaped oxide layer.

As shown in FIG. 5, a photodiode structure 100 has a wedge-shaped backend $SiO_2$ layer 102 on a light-sensitive (photoactive) region 101 of the photodiode. For example, after final planarization (e.g., after depositing the last metal layer 104), the wedge-shaped $SiO_2$ layer can be formed on top of the active photodiode area 106. In particular, a photoresist layer on the $SiO_2$ can be exposed and developed using a mask as described above, and then the $SiO_2$ can be etched such that the wedge structure in the photoresist is translated to the $SiO_2$ layer. The resulting photodiode structure 100 has a continuously variable thickness of backend $SiO_2$. The structure can result in averaging of ripples caused by light interference (i.e., oscillating reflectivity) because different thicknesses have different phases for the ripples. Thus, the different thicknesses of the oxide layer 102 can help average out the interference effects, thereby resulting in smoother photodiode responsivity. In particular, the resulting photodiode structure 100 can, in some implementations, result in a more consistent device-to-device frequency response than a photodiode with a flat $SiO_2$ layer.

Figure 6:
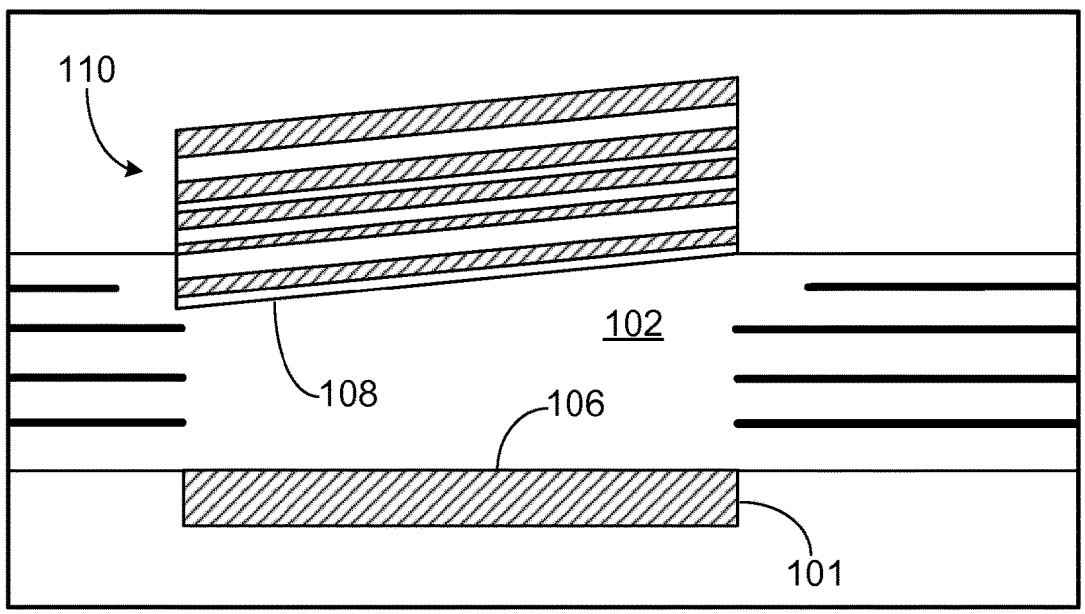
FIG. 6 illustrates another example of a light sensing device including a wedge-shaped oxide layer.

The relatively smooth upper surface 108 of the wedge-shaped $SiO_2$ layer 102 also can facilitate the subsequent deposition of optical-quality filter layer(s). For example, as illustrated in FIG. 6, one or more optical filter layers (e.g., color coating or dielectric filters) 110 can be formed on the smooth upper surface 108 of the $SiO_2$ layer 102. The combined lithography and etching described above can be used to achieve a wedge-shaped or sloped surface 108 that is sufficiently smooth to facilitate the deposition of the dielectric filter layer(s) directly on top of the surface 108.

Figure 7:
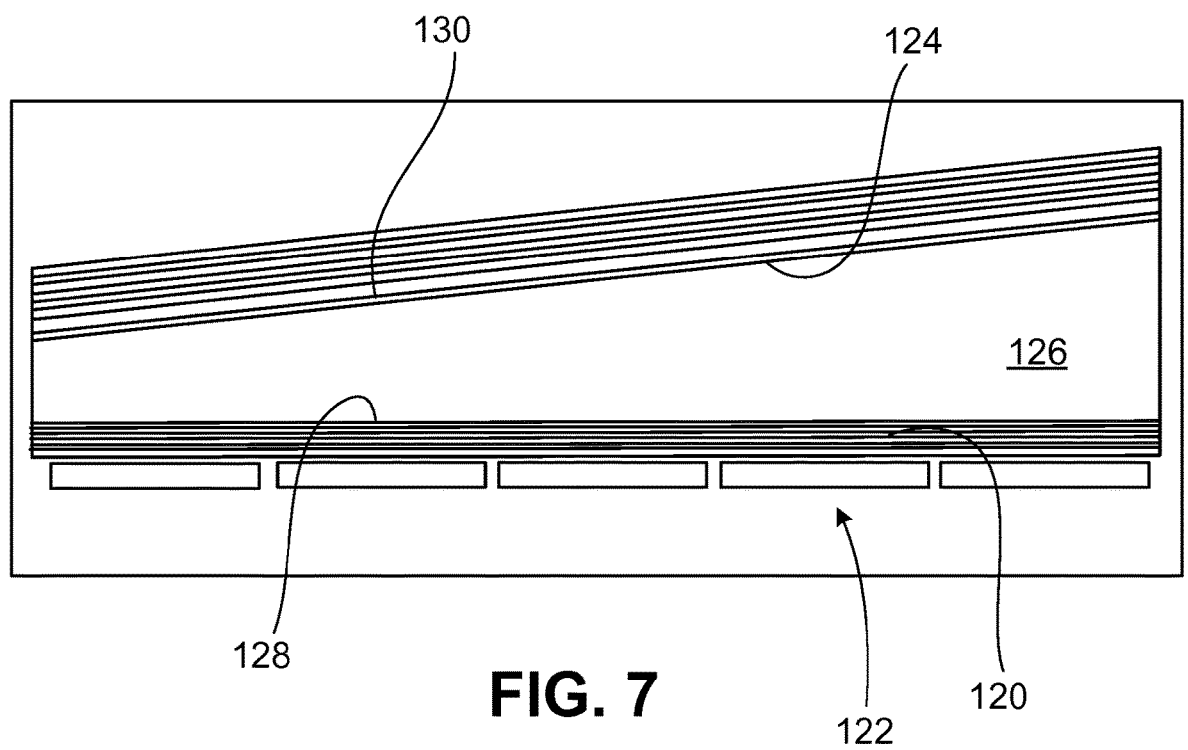
FIG. 7 illustrates an example of Fabry-Perot interferometer including a wedge-shaped cavity layer.

The combined lithography and etching technique(s) described above also can be used for single-step fabrication of the cavity of Fabry-Perot interferometer or etalon to provide filters of different wavelengths. A Fabry-Perot interferometer or etalon, can be composed of a transparent plate with two partially reflecting surfaces (e.g., partially reflecting mirrors). The transmission spectrum as a function of wavelength exhibits peaks of large transmission corresponding to resonances of the etalon. FIG. 7 illustrates an example of a structure in which layers for Fabry-Perot type bottom filters 120 are deposited on a photodiode array 122. The filters 120 can be optimized for reflectivity in a desired wavelength range and having specified filter widths. A thick layer of filter material (e.g., $SiO_2$) then is deposited on the bottom filters 120, and the combined lithography and etching technique(s) described above is used to achieve a wedge-shaped or sloped surface 124. In this case, the photomask can be designed such that a wedge-shaped structure 126 of specified width remains on top of the array 122 and serves as the cavity for the Fabry-Perot device. The width of the cavity 126 can be optimized for different ranges by depositing the last layer 128 of the bottom mirror using the same material as the etalon. A similar result can be achieved using the first layer of the top mirror 130. Further, the top mirror(s) can be deposited to optimize for the desired reflectivity in a selected range to achieve a specified transmission width. In some cases, another minor can be deposited on top to block light in a specified wavelength range. This additional minor can be deposited, for example, as part of the same process steps as the top Fabry-Pérot mirrors.

The combined lithography and etching techniques described above also can be used, for example, to fabricate very small structures (e.g., a few microns in diameter) and designed to can act as collimating lenses with a focusing length of tens of microns. These structures can be used, for example, for improved light collection on small photodiodes to channel light from inactive areas (e.g., metal connections) to an active area even in situations where there is a limited thickness of backend oxide (e.g., <10 um). Examples of such structures include collimating optical elements (e.g., micro lenses) or Fresnel lenses for improved light harvesting. In some cases, an anisotropic etch can be used as well.

Although particular embodiments are described in detail above, various modifications can be made within the spirit of the invention. Accordingly, other implementations are within the scope of the claims.

The invention claimed is:

1. A method of forming a three-dimensional structure, the method comprising:
    applying photoresist on a layer over a light sensing device;
    using a photolithography system to expose the photoresist, wherein the photolithography system includes a photomask having a pattern thereon, the pattern providing varying pattern density across a surface of the photomask and having a pitch that is less than a resolution of the photolithography system;
    subsequently developing the photoresist such that photoresist remaining on the layer has a three-dimensional profile defined by the photomask; and
    using an isotropic etchant to etch the layer such that the three-dimensional profile of the photoresist is transferred to the layer.

2. The method of claim 1 wherein the layer is composed of $SiO_2$.

3. The method of claim 1 wherein the pattern density of the photomask increases continuously from a first end of the pattern to an opposite second end of the pattern.

4. The method of claim 1 wherein the pattern density of the pattern on the photomask varies continuously by using different sized openings in a light blocking layer.

5. The method of claim 1 wherein the pattern has a pitch size that is constant.

6. The method of claim 1 wherein the pattern has a pitch size that is modulated.

7. The method of claim 1 wherein the isotropic etchant includes fluorine.

8. The method of claim 1 further including forming an optical filter layer on a surface of the layer to which the three-dimensional profile is transferred.

9. The method of claim 1 further including forming a stack of optical filter layers on a surface of the layer to which the three-dimensional profile is transferred.

10. The method of claim 1 the layer to which the three-dimensional profile is transferred serves as a cavity of a Farby-Perot interferometer.

11. The method of claim 1 wherein the pattern on the photomask comprises a border zone layout.

12. The method of claim 2 wherein the isotropic etchant results in an etch rate of the photoresist that is about the same as an etch rate of the $SiO_2$.

13. The method of claim 1 wherein the three-dimensional profile has a continuously increasing thickness and/or a wedge-shape.

* * * * *